United States Patent
Chen et al.

(10) Patent No.: US 7,999,361 B1
(45) Date of Patent: Aug. 16, 2011

(54) SHIELDING STRUCTURE FOR TRANSMISSION LINES

(75) Inventors: Shuxian Chen, Fremont, CA (US); Jeffrey T. Watt, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/709,289

(22) Filed: Feb. 19, 2010

(51) Int. Cl.
   *H01L 23/28* (2006.01)
(52) U.S. Cl. ................................ 257/659; 257/E23.114
(58) Field of Classification Search .................. 257/659, 257/758, 531–532, E23.114
   See application file for complete search history.

(56) References Cited

U.S. PATENT DOCUMENTS

| | | | |
|---|---|---|---|
| 6,747,340 B2 * | 6/2004 | Barnes et al. | 257/659 |
| 6,838,770 B2 * | 1/2005 | Itoh | 257/758 |
| 6,844,204 B2 * | 1/2005 | Asao | 438/3 |
| 6,870,456 B2 * | 3/2005 | Gardner | 336/200 |
| 6,885,275 B1 * | 4/2005 | Chang | 336/200 |
| 6,903,459 B2 * | 6/2005 | Nakatani | 257/758 |
| 6,970,064 B2 * | 11/2005 | Zhang et al. | 336/200 |
| 6,982,477 B2 * | 1/2006 | Adan | 257/659 |
| 7,339,256 B2 * | 3/2008 | Nakamura et al. | 257/659 |
| 7,417,301 B2 * | 8/2008 | Taghizadeh-Kaschani | 257/531 |
| 7,504,710 B2 * | 3/2009 | Suzuki | 257/659 |
| 7,508,019 B2 * | 3/2009 | Inoue et al. | 257/294 |
| 7,755,457 B2 * | 7/2010 | Lee et al. | 333/204 |

* cited by examiner

*Primary Examiner* — Nathan W Ha
(74) *Attorney, Agent, or Firm* — Ward & Zinna, LLC

(57) ABSTRACT

A shielding structure comprises first and second comb-like structures defined in a first metallization layer on an integrated circuit, each comb-like structure comprising a plurality of teeth, the teeth of each comb-like structure extending toward the other comb-like structure; a first plurality of electrically conducting vias extending upward from the first comb-like structure; a second plurality of electrically conducting vias extending upward from the second comb-like structure; first and second planar structures in a second metallization layer above the first metallization layer; a third plurality of electrically conducting vias extending downward from the first planar structure toward the first plurality of electrically conducting vias; and a fourth plurality of electrically conducting vias extending downward from the second planar structure toward the second plurality of electrically conducting vias. The first and second comb-like structures, the first and second planar structures and the first, second, third, and fourth electrically conducting vias all being at substantially the same potential, preferably ground. In one embodiment, one or more signal lines are located in the second metallization layer between the first and second planar structures; and in another embodiment they are located in a third metallization layer between the first and second metallization layers.

20 Claims, 5 Drawing Sheets

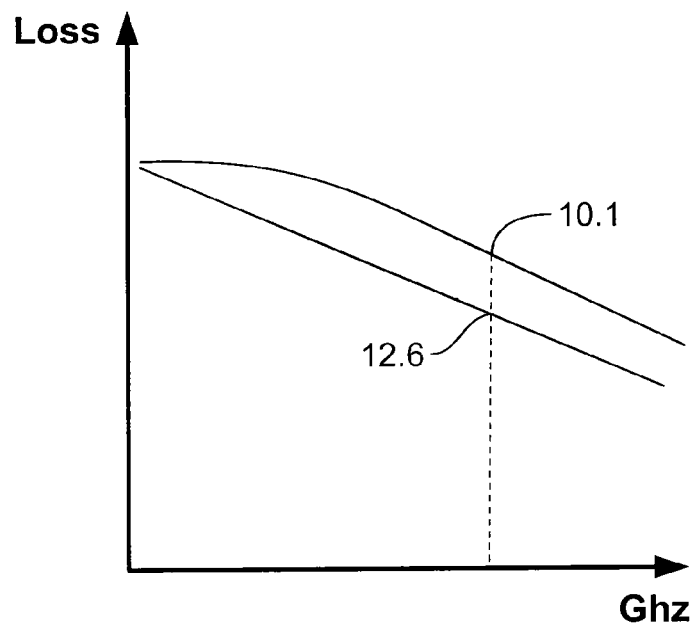
FIG. 6
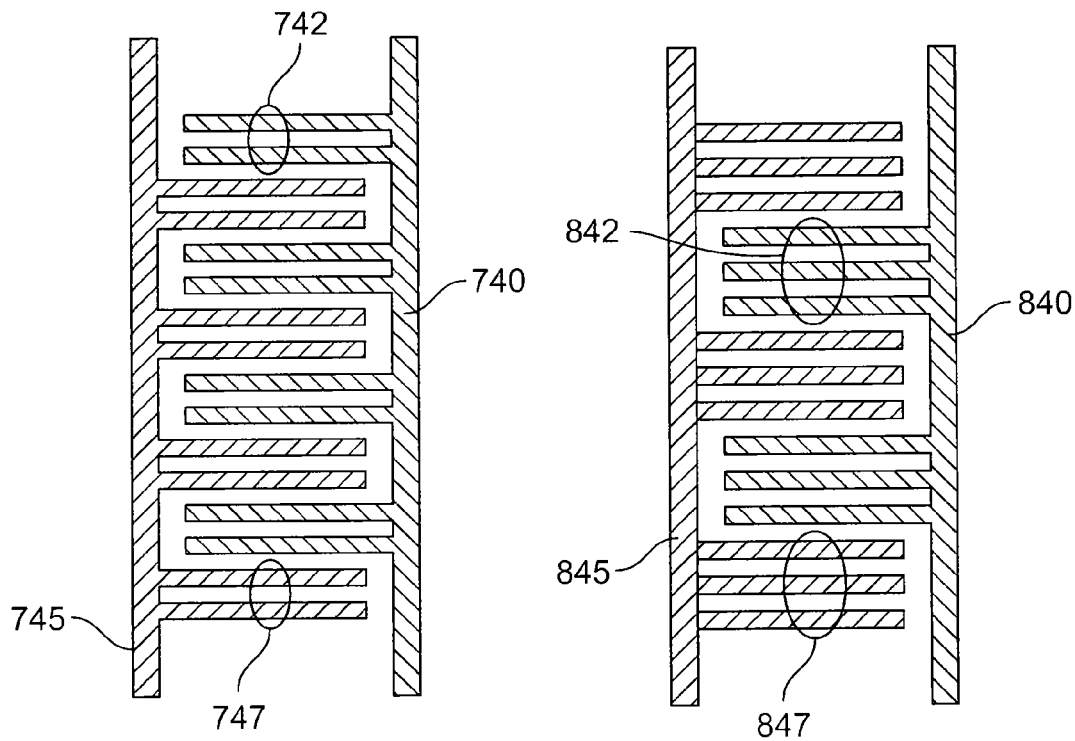
FIG. 7
FIG. 8

SHIELDING STRUCTURE FOR TRANSMISSION LINES

BACKGROUND OF THE INVENTION

This relates to shielding structures formed in the back end of integrated circuits.

A typical integrated circuit comprises a semiconductor substrate in and on which are defined a multitude of transistors and a series of metal interconnect layers on top of the substrate. The interconnect layers are insulated from one another by intermetallic dielectric layers. Interconnection paths are defined in the metallic layers and selective connections are made between the paths in the various layers so as to connect the transistors formed in the substrate to each other and to external connections. For additional information, see, for example, Plummer et al, *Silicon VLSI Technology*, ch. 11 (Prentice Hall, 2000); Doering et al (ed.), *Handbook of Semiconductor Manufacturing Technology* ($2^{nd}$ ed.) (CRC Press 2008).

In recent years, the frequencies of signals transmitted on some of the interconnection paths of an integrated circuit have risen into the GigaHertz (GHz) range. At these frequencies, it becomes desirable to shield the interconnection path; and shielding structures used for many years in conventional microwave technology have been adapted for use in integrated circuits. FIGS. 1A-1F depict cross-sections of several conventional shielding structures. In the transverse section of FIG. 1A, a microstrip 10 comprises a signal line 12 located above and insulated from a ground plane 14 that provides a current return path. In other embodiments, a pair of transmission lines may be used in place of a single signal line to provide differential-type signaling. When implemented in an integrated circuit, the signal line 12 is defined in one metallization layer, the ground plane 14 is defined in a second metallization layer and the signal line and ground plane are separated by at least one intermetallic dielectric layer. Illustratively, ground plane 14 may be a continuous two-dimensional sheet with no openings in it or may comprise a plurality of metal strips connected together at each end in a ladder-like configuration as shown in the horizontal section of FIG. 1B. Other patterns of connected metallization may also be used; and in some cases the ground plane can be the silicon substrate.

In the transverse section of FIG. 1C, a co-planar waveguide (CPW) 20 comprises a signal line 22 located between two ground planes 24, 25. When implemented in an integrated circuit, the signal line and ground planes of the coplanar waveguide are all implemented in the same metallization layer and insulated from the substrate of the integrated circuit by at least one intermetallic dielectric layer. Again, each ground plane may be a continuous two-dimensional sheet with no openings or it may comprise a ladder-like array of connected strips as shown in FIG. 1B. Other patterns of connected metallization may also be used.

In the transverse section of FIG. 1D, a grounded co-planar waveguide (GCPW) 30 comprises a signal line 32 located between two ground planes 34, 35 and above a third ground plane 36. The ground planes 34, 35 are electrically connected to ground plane 36 by electrically conductive sidewalls 38, 39. When implemented in an integrated circuit, signal line 32 and ground planes 34, 35 are defined in a first metallization layer, ground plane 36 is defined in a second metallization layer beneath the first layer, and the first and second metallization layers are separated by at least one intermetallic dielectric layer. Illustratively, ground plane 36 may be a continuous two-dimensional sheet with no openings or it may comprise a ladder-like array of connected strips as shown in FIG. 1B or another pattern of connected metallization. The sidewalls are formed using stacks of vias that extend between the upper and lower metallization layers. As shown in the lateral section of FIG. 1E, a first plurality of electrically conducting via stacks 138 form a sidewall that connects upper ground plane 34 to lower ground plane 36 and a second plurality of electrically conducting via stacks similar to that of FIG. 1E forms a sidewall that connects upper ground plane 35 to lower ground plane 36. Additional rows of electrically conducting vias may be connected in parallel to connect the upper and lower ground planes.

In the transverse section of FIG. 1F, a stripline 50 comprises a signal line 52 located between an upper ground plane 54 and a lower ground plane 56. Optionally, the upper and lower ground planes are electrically connected by electrically conductive sidewalls 58, 59 so that the signal line is in the center of the region enclosed by the ground planes and sidewalls. When stripline 50 is implemented in an integrated circuit, signal line 52 is defined in one metallization layer, ground plane 54 is defined in a second metallization layer above it and ground plane 56 is defined in a third metallization layer below it. Optionally, a first plurality of electrically conducting vias form a sidewall that connects upper ground plane 54 to lower ground plane 56 on one side of the signal line 52; and a second plurality of electrically conducting vias form a sidewall that connects upper ground plane 54 to lower ground plane 56 on the other side of signal line 52. Again, the ground planes may be continuous two-dimensional sheets with no openings or ladder-like arrays of connected strips as shown in FIG. 1B or some other pattern of connected metallization; and the vias may be similar to those shown in FIG. 1E. The advantages and disadvantages of several types of integrated circuit transmission lines are discussed, for example, at S. Pellerano et al., "A 64 GHz LNA with 15.5 dB Gain and 6.5 dB NF in 90 nm CMOS," *IEEE J. of Solid-State Circuits*, Vol. 43, No. 7. pp. 1543-52 (July 2008)

SUMMARY OF THE PRESENT INVENTION

The present invention is an improved shielding structure that can be implemented in the metallization layers of an integrated circuit. The improved shielding structure reduces parasitic coupling between the transmission line(s) and the shielding structure with the result that the shielding structure has lower insertion loss than prior art shielding structures. Further, it has a better signal/noise ratio.

In a preferred embodiment of the invention, the shielding structure comprises: first and second comb-like structures defined in a first metallization layer on an integrated circuit, each comb-like structure comprising a plurality of teeth, the teeth of each comb-like structure extending toward the other comb-like structure; a first plurality of electrically conducting vias extending upward from the first comb-like structure; a second plurality of electrically conducting vias extending upward from the second comb-like structure; first and second planar structures in a second metallization layer above the first metallization layer; a third plurality of electrically conducting vias extending downward from the first planar structure toward the first plurality of electrically conducting vias; and a fourth plurality of electrically conducting vias extending downward from the second planar structure toward the second plurality of electrically conducting vias. At least one signal line is located in the second metallization layer between the first and second planar structures; and the first and second comb-like structures, the first and second planar structures and the first, second, third, and fourth electrically conducting vias are all at substantially the same potential, which preferably is ground.

Numerous variations may be practiced in the preferred embodiment. For example, a pair of signal lines may be used to carry differential-type signals; the first and second planar structures may also be comb-like structures; and multiple rows of electrically conducting vias may extend from the planar structures and/or the comb-like structures.

While the preferred embodiment may be regarded as a modification of a grounded co-planar waveguide, the invention may also be practiced in other types of waveguides such as microstrips and striplines.

BRIEF DESCRIPTION OF THE DRAWINGS

These and other objects and advantages of the present invention will be apparent to those of ordinary skill in the art in view of the following detailed description in which:

FIG. 6 is a plot of transmission loss versus operating frequency for the shielding structure of the present invention and a prior art shielding structure; and FIGS. 7 and 8 are horizontal sections of alternatives that may be used in the practice of the invention.

DETAILED DESCRIPTION

Figure 2:
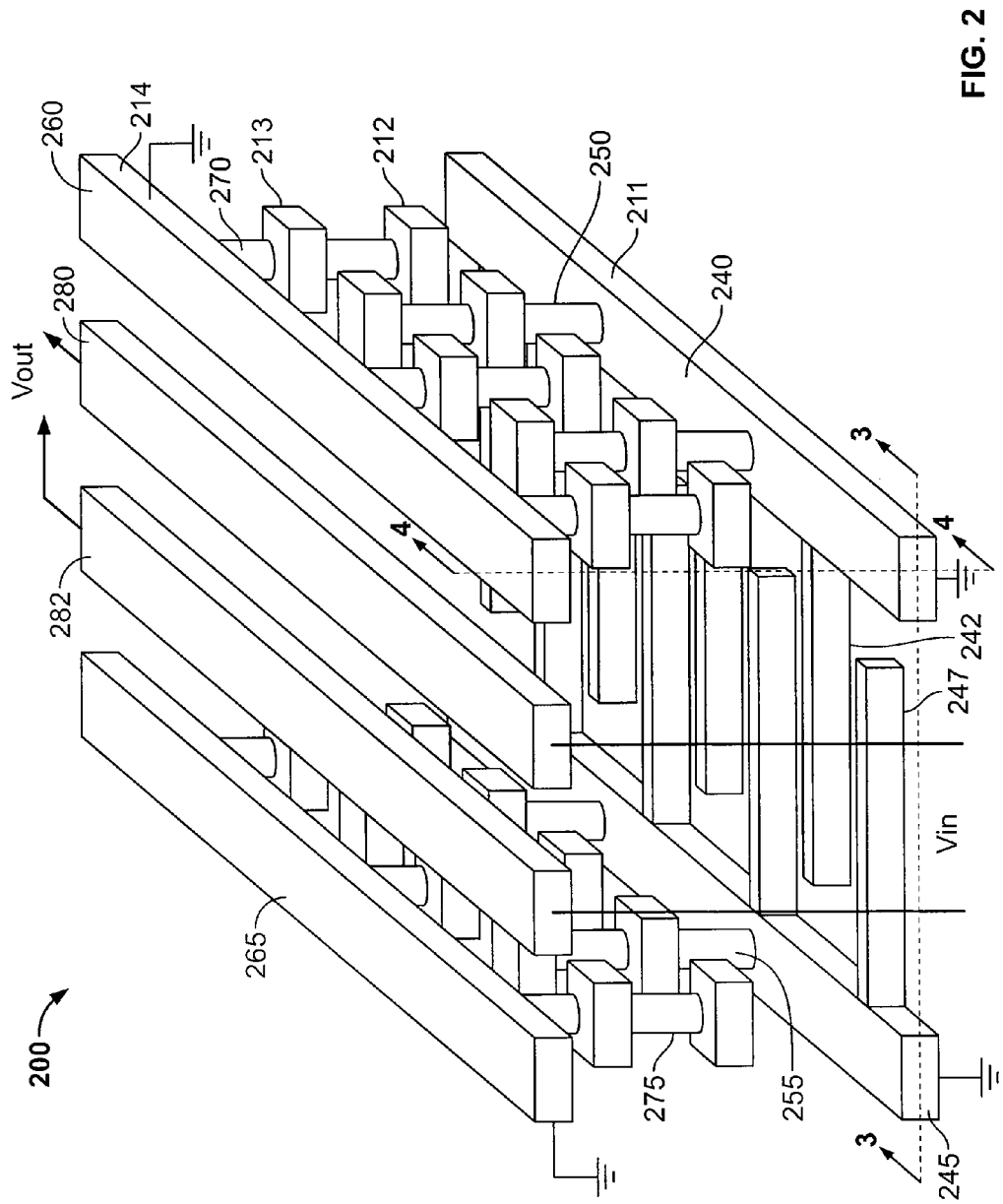
FIG. 2 is a perspective view of an illustrative embodiment of the invention.
Figure 3:
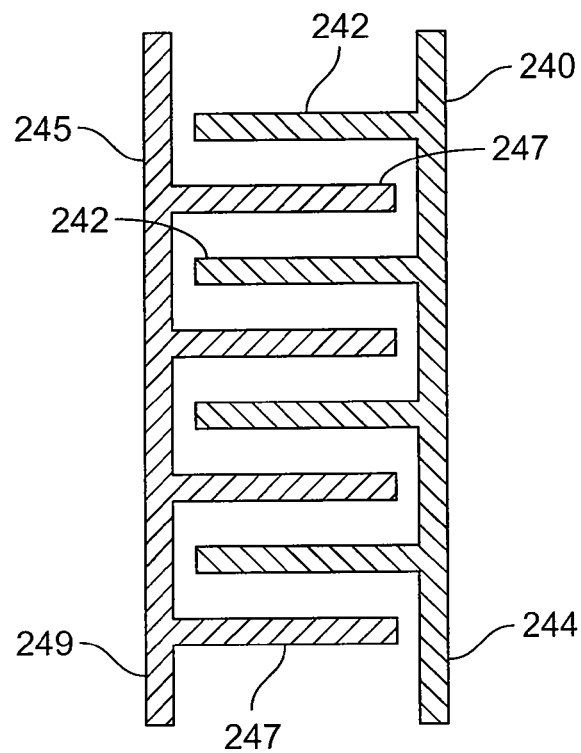
FIG. 3 is a cross-section along line 3-3 of FIG. 2.
Figure 4:
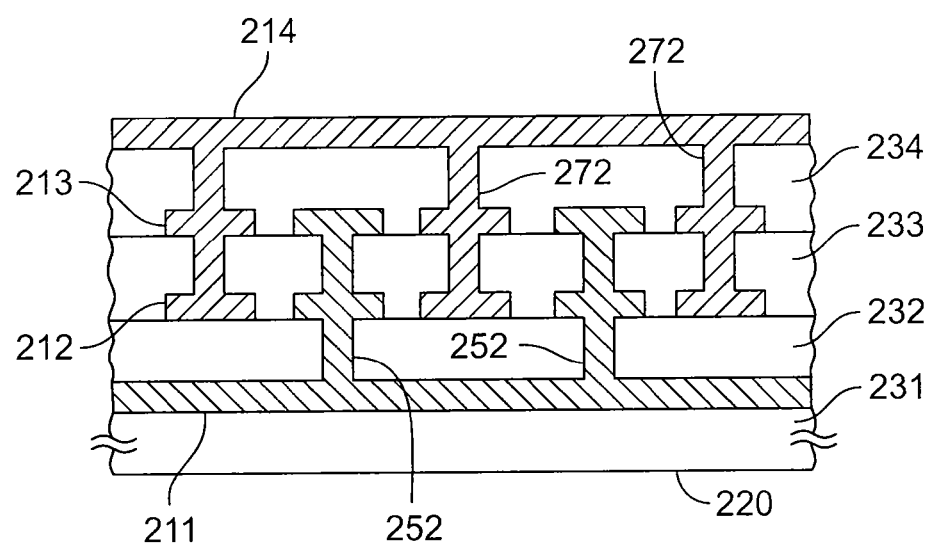
FIG. 4 is a cross-section along line 4-4 of FIG. 2.

FIG. 2 is a perspective view of an illustrative embodiment of a shielding structure 200 of the present invention; and FIGS. 3 and 4 are cross-sections along lines 3-3 and 4-4, respectively, of FIG. 2. Shielding structure 200 is formed in an integrated circuit in a plurality of metallization layers 211-214 on a semiconductor substrate 220. The metallization layers are separated from each other and from substrate 220 by intermetallic dielectric layers 231-234 (shown in FIG. 4 but not shown in FIG. 2 for reasons of clarity). Shielding structure 200 comprises first and second comb-like structures 240, 245 defined in first metallization layer 211, each comb-like structure comprising first and second pluralities of teeth 242, 247 that extend toward the other comb-like structure; a first plurality of electrically conducting vias 250 that extend upward from the first comb-like structure 240; a second plurality of electrically conducting vias 255 that extend upward from the second comb-like structure 245; first and second planar structures 260, 265 in a second metallization layer 214 above the first metallization layer; a third plurality of electrically conducting vias 270 that extend downward from the first planar structure 260 toward the first plurality of electrically conducting vias 250; and a fourth plurality of electrically conducting vias 275 that extend downward from the second planar structure 265 toward the second plurality of electrically conducting vias, 255. Signal lines 280, 282 are located in metallization layer 214 between the first and second planar structures. The first and second comb-like structures, the first and second planar structures, and the first, second, third and fourth electrically conducting vias are all at the same potential, preferably ground.

Preferably, the metallization layers are the uppermost metallization layers of an integrated circuit. By way of example but not limitation, metallization layer 214 might be the uppermost layer of the integrated circuit while metallization layer 211 might be several layers below it, the number of layers depending on various design criteria. In other cases, metallization layer 214 might not be the uppermost layer of the integrated circuit.

A horizontal cross-section of metallization layer 211 along line 3-3 of FIG. 2 is shown in FIG. 3. As shown therein, the first comb-like structure 240 comprises a first plurality of teeth 242; and the second comb-like structure 245 comprises a second plurality of teeth 247. The teeth are parallel to one another. The teeth of the first plurality are connected together by a first transverse element 244; and the teeth of the second plurality are connected together by a second transverse element 249. As shown in FIG. 3, the teeth of the first comb-like structure 240 extend between the teeth of the second comb-like structure 240 but they do not contact the teeth of the second comb-like structure. However, as indicated above, the teeth are at the same potential. To accomplish this, an electrical connection is maintained between the two comb-like structures if only through the ground connection. Alternatively, one or a small number ($\leq 10\%$) of the teeth of the two comb-like structures may be directly connected together (not shown).

The comb-like structures 240, 245 are formed by defining the structures in metallization layer 211 using well-known etching technology to define the appropriate patterns in the metallization layer . . . .

A vertical cross-section through vias 250, 270 along line 4-4 of FIG. 2 is shown in FIG. 4. The vertical cross-section through vias 255, 275 is similar. As shown in FIG. 4, vias 250 extend upward in stacks 252 from metallization layer 211, through intermetallic dielectric layer 232, metallization layer 212, and intermetallic dielectric layer 233 to metallization layer 213. Thus, stacks 252 do not reach metallization layer 214. Vias 270 extend downward in stacks 272 from metallization layer 214, through intermetallic dielectric layer 234, metallization layer 213, and intermetallic dielectric layer 233 to metallization layer 212. Thus, stacks 272 do not reach metallization layer 211. In addition, while stacks 252 extend between stacks 272, they do not contact each other at metallization layers 212 or 213. However, as indicated above, vias 250 and vias 270 are at the same potential. To accomplish this, some of vias 250, 270 may be connected to each other by extending the via stack to the appropriate metallization layer or by connecting the stacks by metallization layers 212 and/or 213. Only a small number ($\leq 10\%$) of vias relative to the total number of vias should be connected in this way. Alternatively, the vias may be connected together through the ground connection.

The vias are formed by conventional semiconductor processes in which holes are etched in an intermetallic dielectric layer down to the metallic layer immediately below and the holes are then filled with a conducting material such as aluminum or copper. Well known processes are then used to form the next metallic layer on top of the dielectric layer so that it is electrically connected to the filled holes; and this layer is then etched to separate the via stacks. A dielectric layer is then formed on the metallic layer; and the process is repeated to form the next layer of vias in the stacks. Further details on the via formation process may be found at pages 702-706 of Plummer, cited above, which are hereby incorporated by reference herein.

Numerous variations may be practiced in the embodiment depicted in FIG. 2. For example, a single signal line may be used instead of the pair of signal lines 280, 282. The first and second planar structures may be comb-like structures; and multiple rows of electrically conducting vias may extend from the planar structures and/or the comb-like structures.

Figure 5:
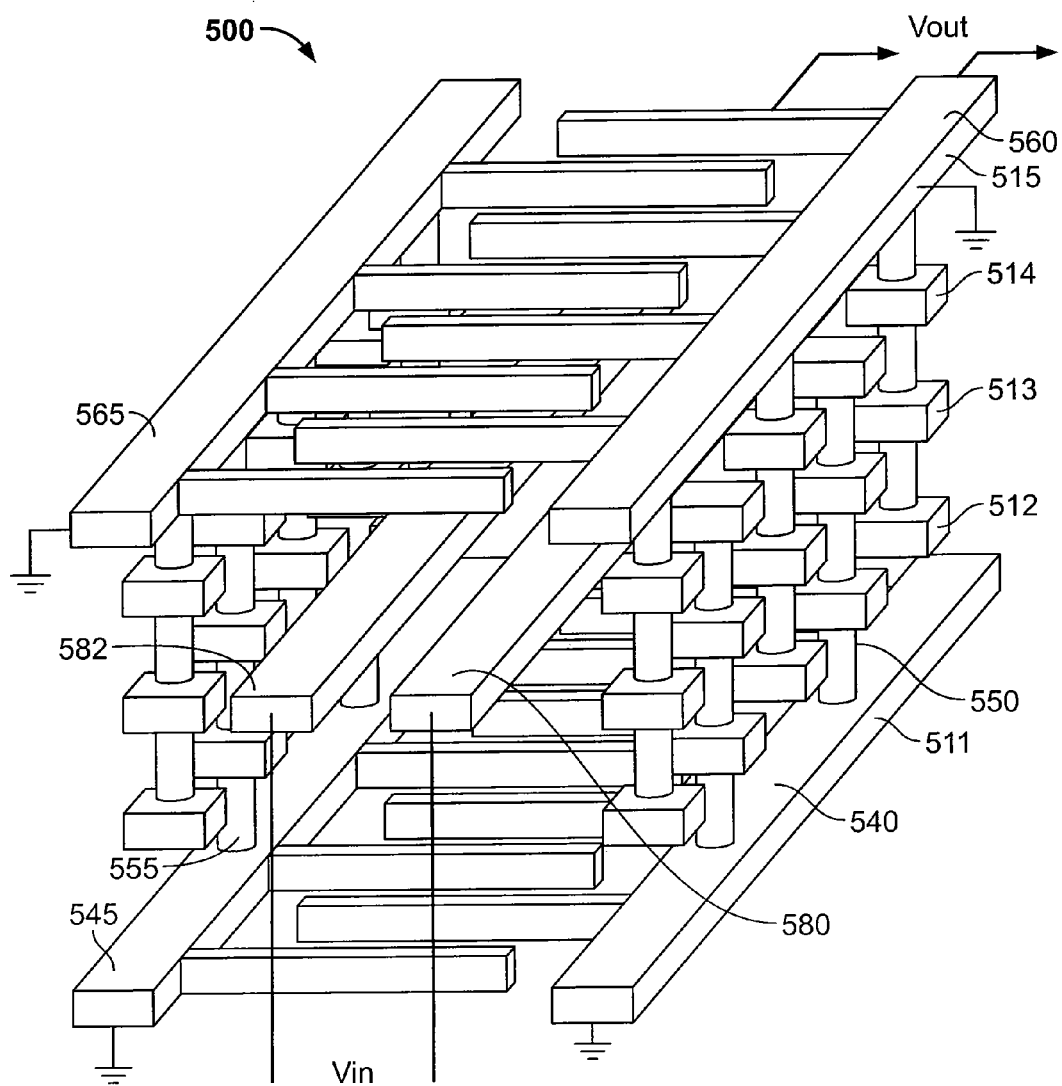
FIG. 5 is a perspective view of a second embodiment of the invention.

The invention may also be practiced used other waveguide configurations. For example, as shown in FIG. 5, a stripline can be implemented in which first and second comb-like structures 540, 545 are defined in a lower metallization layer 511, third and fourth comb-like structures 560, 565 are defined in an upper metallization layer 515; and one or more signal lines 580, 582 are defined in a third metallization layer 513 located between the upper and lower metallization layers. Illustratively, horizontal sections through both the lower metallization layer and the upper metallization layer are the same as that depicted in FIG. 3. Optionally, sidewalls similar to those depicted in FIG. 4 may be formed by extending via stacks upwards from the comb-like structures in the lower metallization layer and downwards from the comb-like structures in the upper metallization layer. In the illustrative embodiment of FIG. 5, the stripline is formed in five metallization layers 511-515; but the invention may be practiced using a greater number or a lesser number of metallization layers.

Figure 1A:
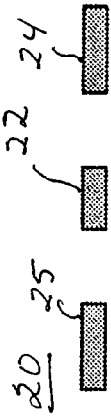
FIGS. 1A-1F are cross-sections of illustrative prior art waveguide structures.
Figure 1D:
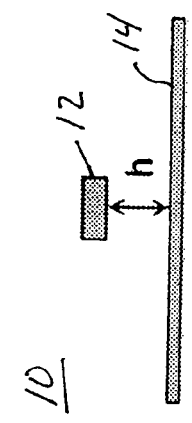
Figure 1B:
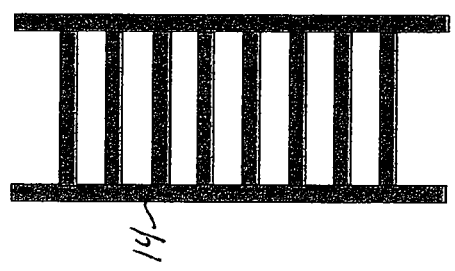
Figure 1E:
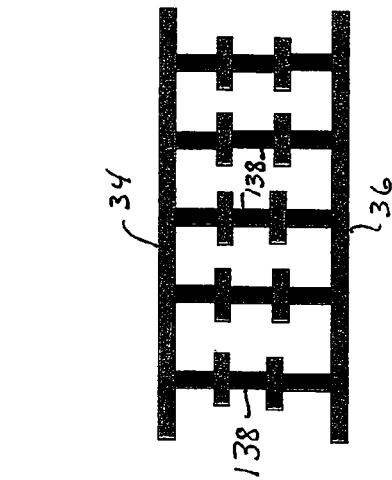
Figure 1C:
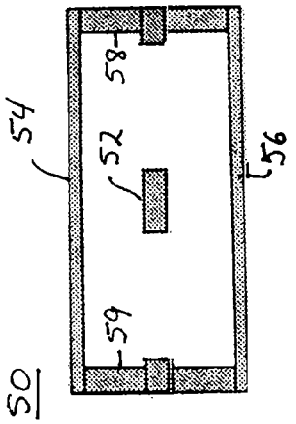
Figure 1F:
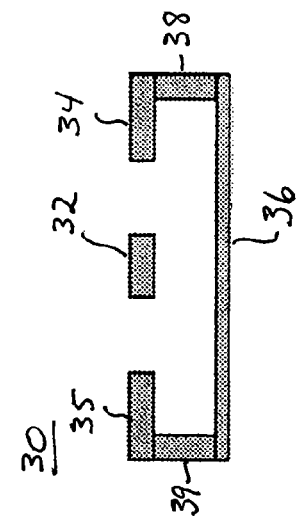

Practice of the invention has been observed to reduce waveguide insertion loss by approximately 20% compared to a conventional grounded co-planar waveguide such as that depicted in FIGS. 1D, 1B and 1E. A plot of simulated transmission loss versus frequency is set forth in FIG. 6. As shown therein, at 12.5 GHz the transmission loss for the waveguide of FIG. 2 is 10.1 dB/mm while the loss for the conventional waveguide is 12.6 dB/mm.

As will be apparent to those skilled in the art, numerous variations may be practiced within the spirit and scope of the present invention. For example, while horizontal cross-section of FIG. 3 depicts an arrangement in which each finger of comb-like structure 240 extends between two fingers of comb-like structure 245, comb-like structures could be used where a pair of fingers 742 of one comb-like structure 740 extend between two pairs of fingers 747 of the second comb-like structure 745, as depicted in FIG. 7 or where a triplet of fingers 842 of one comb-like structure 840 extend between two triplets of fingers 847 of the second comb-like structure 845 as depicted in FIG. 8. Even larger groupings of fingers might be used; and groupings of different numbers of fingers can be used at different places in the comb-like structures. Similarly, pairs (or triplets, or more) of vias might extend downward between two pairs (or triplets, or more) of upwardly extending vias; and groupings of different numbers of vias can be used at different places in the sidewalls. While FIGS. 2 and 5 disclose structures in which the transmission lines are formed in the same metallization layer, structures may also be used in which the transmission lines are located in different metallization layers.

What is claimed is:

1. A shielding structure comprising:
   first and second comb-like structures defined in a first metallization layer on an integrated circuit, each comb-like structure comprising a plurality of teeth, the teeth of each comb-like structure extending toward the other comb-like structure;
   a first plurality of electrically conducting vias extending upward from the first comb-like structure;
   a second plurality of electrically conducting vias extending upward from the second comb-like structure;
   first and second planar structures in a second metallization layer above the first metallization layer;
   a third plurality of electrically conducting vias extending downward from the first planar structure toward the first plurality of electrically conducting vias; and
   a fourth plurality of electrically conducting vias extending downward from the second planar structure toward the second plurality of electrically conducting vias, said first and second comb-like structures, said first and second planar structures and said first, second, third, and fourth electrically conducting vias all being at substantially the same potential.

2. The shielding structure of claim 1 wherein the teeth of each comb-like structure extend between the teeth of the other comb-like structure.

3. The shielding structure of claim 1 wherein the electrically conducting vias of the first plurality of vias extend between the electrically conducting vias of the third plurality of vias.

4. The shielding structure of claim 1 further comprising a first signal line located in the second metallization layer between the first and second planar structures.

5. The shielding structure of claim 1 further comprising first and second signal lines located in the second metallization layer between the first and second planar structures.

6. The shielding structure of claim 1 wherein at least one of the planar structures is a comb-like structure.

7. The shielding structure of claim 1 wherein the first and second planar structures are third and fourth comb-like structures, each comb-like structure comprising a plurality of teeth, the teeth of the third comb-like structure and the teeth of the fourth comb-like structure extending toward each other.

8. The shielding structure of claim 7 wherein at least one signal line is located in a third metallization layer between the first and second metallization layers.

9. The shielding structure of claim 7 wherein a first signal line is located in a third metallization layer between the first and second metallization layers and a second signal line is located in a fourth metallization layer between the first and second metallization layers.

10. A shielding structure comprising:
    first and second arrays of conductive elements defined in a first metallization layer on an integrated circuit, the conductive elements of the first array being connected together and extending between the conductive elements of the second array, the conductive elements of the second array being connected together;
    a first plurality of electrically conducting vias extending upward from the first array;
    a second plurality of electrically conducting vias extending upward from the second array;
    first and second planar structures in a second metallization layer above the first metallization layer;
    a third plurality of electrically conducting vias extending downward from the first planar structure toward the first plurality of electrically conducting vias; and
    a fourth plurality of electrically conducting vias extending downward from the second planar structure toward the second plurality of electrically conducting vias, said first and second arrays, said first and second planar structures and said first, second, third, and fourth electrically conducting vias all being at substantially the same potential.

11. The shielding structure of claim 10 wherein the electrically conducting vias of the first plurality of vias extend between the electrically conducting vias of the second plurality of vias.

12. The shielding structure of claim 10 further comprising a first signal line located in the second metallization layer between the first and second planar structures.

13. The shielding structure of claim 10 further comprising first and second signal lines located in the second metallization layer between the first and second planar structures.

14. The shielding structure of claim 10 wherein the first and second planar elements are third and fourth arrays of conductive elements defined in the second metallization layer, the conductive elements of the third array being connected together and extending between the conductive elements of the fourth array, the conductive elements of the fourth array being connected together.

15. The shielding structure of claim 14 wherein at least one signal line is located in a third metallization layer between the first and second metallization layers.

16. The shielding structure of claim 14 wherein a first signal line is located in a third metallization layer between the first and second metallization layers and a second signal line is located in a fourth metallization layer between the first and second metallization layers.

17. A shielding structure comprising:
  first and second arrays of conductive elements defined in a first metallization layer on an integrated circuit, the conductive elements of the first array being connected together and extending between the conductive elements of the second array, the conductive elements of the second array being connected together;
  third and fourth arrays of conductive elements in a second metallization layer above the first metallization layer, the conductive elements of the third array being connected together and extending between the conductive elements of the fourth array, the conductive elements of the fourth array being connected together; and
  at least one signal line located in a third metallization layer between the first and second metallization layers,
  the first, second, third, and fourth arrays of conductive elements all being at substantially the same potential.

18. The shielding structure of claim 17 wherein the conductive elements in at least one array of conductive elements are connected together in a comb-like structure.

19. The shielding structure of claim 17 further comprising a second signal line located in a fourth metallization layer between the first and second metallization layers.

20. The shielding structure of claim 17 further comprising a second signal line located in the third metallization layer.

* * * * *